US010433453B2

(12) United States Patent
Franz

(10) Patent No.: US 10,433,453 B2
(45) Date of Patent: Oct. 1, 2019

(54) SYSTEM FOR SEALINGLY COUPLING GROUPS OF SERVER CABINETS

(71) Applicant: Hewlett Packard Enterprise Development LP, Houston, TX (US)

(72) Inventor: Perry D. Franz, Elk Mound, WI (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 0 days.

(21) Appl. No.: 15/705,757

(22) Filed: Sep. 15, 2017

(65) Prior Publication Data

US 2018/0027683 A1   Jan. 25, 2018

Related U.S. Application Data

(62) Division of application No. 14/550,444, filed on Nov. 21, 2014, now abandoned.

(60) Provisional application No. 61/908,433, filed on Nov. 25, 2013.

(51) Int. Cl.
*H05K 7/00* (2006.01)
*H05K 7/14* (2006.01)

(52) U.S. Cl.
CPC ...... *H05K 7/1488* (2013.01); *Y10T 29/49826* (2015.01)

(58) Field of Classification Search
None
See application file for complete search history.

(56) References Cited

U.S. PATENT DOCUMENTS

| 2,475,130 | A | * | 7/1949 | Davis | B60B 33/0089 188/5 |
| 4,073,369 | A | * | 2/1978 | Nordskog | B60T 1/14 188/32 |
| 5,137,159 | A | | 8/1992 | Collins et al. | |
| 5,644,991 | A | | 7/1997 | Prevot et al. | |
| 6,105,511 | A | * | 8/2000 | Bridges | H05K 7/1488 108/55.1 |
| 6,539,881 | B2 | * | 4/2003 | Underbrink | B65D 19/42 108/55.3 |
| 6,669,314 | B1 | | 12/2003 | Nemec et al. | |
| 7,699,180 | B2 | * | 4/2010 | Mollard | B65D 19/44 211/26 |
| 8,113,478 | B2 | * | 2/2012 | Hsiao | B65D 19/38 248/220.22 |
| 8,251,467 | B2 | | 8/2012 | Peng et al. | |
| 9,248,941 | B1 | * | 2/2016 | Legel | H05K 7/1488 |
| 2004/0174105 | A1 | * | 9/2004 | Hung | A47B 91/02 312/351.1 |
| 2007/0151751 | A1 | | 7/2007 | Robbins et al. | |
| 2008/0218948 | A1 | * | 9/2008 | Lai | H05K 5/0234 361/724 |
| 2008/0316116 | A1 | * | 12/2008 | Hobson | H01Q 1/243 343/702 |
| 2010/0044990 | A1 | | 2/2010 | Woodbury, II | |

(Continued)

*Primary Examiner* — Courtney L Smith
*Assistant Examiner* — Rashen E Morrison

(57) ABSTRACT

A computer server rack has a platform, configured to support at least one server, with a front end and an opposed back end. The server rack also has a height adjuster coupled to the platform, and a control positioned a first distance from the front end and a second distance from the back end. The first distance is smaller than the second distance, and the control is configured to control the height adjuster to change a height of the back end of the platform.

18 Claims, 10 Drawing Sheets

(56) References Cited

U.S. PATENT DOCUMENTS

| | | | |
|---|---|---|---|
| 2011/0260593 A1* | 10/2011 | Peng | H05K 7/1488 312/293.3 |
| 2012/0101627 A1 | 4/2012 | Lert | |
| 2015/0189786 A1* | 7/2015 | Rubenstein | H05K 7/1489 361/679.58 |
| 2016/0107793 A1* | 4/2016 | Jiang | B65D 19/0073 206/599 |
| 2016/0121915 A1* | 5/2016 | Mkandawire | B62B 3/02 414/277 |

* cited by examiner

SYSTEM FOR SEALINGLY COUPLING GROUPS OF SERVER CABINETS

RELATED APPLICATION

The patent application claims priority from U.S. Application No. 61/908,433, entitled "Remote Actuated Leveling Mechanism" and filed Nov. 25, 2013, which is hereby incorporated herein by reference in its entirety. The patent application is a divisional application of U.S. application Ser. No. 14/550,444, entitled "Remote Actuated Leveling Mechanism" and filed Nov. 21, 2014, which is hereby incorporated herein by reference in its entirety.

TECHNICAL FIELD

The present disclosure relates to remote actuated leveling mechanisms that allow cabinets of computer equipment to be arranged on an uneven floor while still being aligned with one another.

BACKGROUND ART

A room's floor is seldom perfectly flat. This can present problems for computer equipment housed within cabinets. For example, when multiple cabinets are positioned against each other, they may become misaligned due to dips in the floor. Moreover, cabinets are conventionally arranged in rows, with aisles positioned along the fronts and backs of each row. The arrangement produces a significant amount of space that is not occupied by operational equipment.

SUMMARY OF THE EMBODIMENTS

In one embodiment of the invention, a computer server rack includes a platform configured to support at least one server. The platform has a front end and an opposing back end, and a height adjuster is coupled to the platform. Moreover, a first control is positioned a first distance from the front end and a second distance from the back end, and the first distance is smaller than the second distance. The first control is configured to control the height adjuster to change a height of a first portion of the back end of the platform.

In some embodiments, the first control is open to the front of the platform. The platform may include an exterior surface, and the first control may be positioned on the exterior surface of the platform. The platform may include a front exterior surface at the front end of the platform, and the first control may be positioned on the front exterior surface of the platform.

In various embodiments, the platform has a top surface, and a cabinet, having a front end and a back end, may be positioned on the top surface of the platform. The cabinet may include an interior with a plurality of chassis, and each chassis may be configured to mount a distinct computer blade server within the interior of the cabinet. Further, the cabinet may include a movable door, positioned at the front end of the cabinet, that enables access to at least one of the distinct computer blade servers.

The height adjuster may include a first pivot bracket that is (1) coupled to an axle of a first back wheel of the platform via a first pivot pin and (2) attached to a first rail connected to the platform. The height adjuster may also include a first linkage coupled to the first pivot bracket and a first draw bar. Movement of the first control may move the first draw bar in a first direction. Further, movement of the draw bar may cause the first linkage to pivot to increase the height of the first portion of the back end. Additionally, movement of the first draw bar in a second direction may cause the first linkage to pivot to decrease the height of the first portion of the back end. The first and second directions may be opposite to one another. In various embodiments, the first control includes a rotatable height adjustment nut. The height adjustment nut may be configured to turn in opposite directions to cause the linkage to pivot to increase and decrease the height of the back end.

Furthermore, the height adjuster may include a second pivot bracket that is (1) coupled to an axle of a second back wheel of the platform via a second pivot pin and (2) attached to a second rail connected to the platform. The height adjuster may also include a second linkage coupled to the second pivot bracket and a second draw bar. Movement of a second control may move the second draw bar in the first direction. Moreover, movement of the second draw bar may cause the second linkage to pivot to increase the height of the second portion of the back end. Further, movement of the second draw bar in a second direction may cause the second linkage to pivot to decrease the height of the second portion of the back end. The first and second directions may be opposite to one another. Additionally, the first and second controls may be independently operable such that the heights of the first and second portions of the back end may be increased or decreased independently of one another.

In a second embodiment of the invention, a method of installing computer equipment in a space includes mounting a first cabinet with at least one server on a first remote actuated leveling mechanism, the first cabinet having a first back end and a first front end. The method also includes mounting a second cabinet with at least one server on a second remote actuated leveling mechanism, the second cabinet having a second back end and a second front end. The method also includes positioning the first and second cabinets so that the first back end and second back end are spaced apart by a first distance. Further, the first and second cabinets are positioned so that the first front end and second front end are spaced apart by a second distance. The first distance is smaller than the second distance, and the first distance may be substantially zero. The method also includes operating at least one of the remote actuated leveling mechanisms to vertically move a portion of the first back end, a portion of the second back end, or portions of both the first and second back ends.

In some embodiments, the method includes vertically moving the portion of the first back end until its height substantially matches the portion of the second back end. The method may include adjusting a control from a front end of the remote actuated leveling mechanism to change a vertical height of a back end of the corresponding cabinet. Throughout the adjusting, a front end of the corresponding cabinet remains at substantially the same height. The method may include rotating a height adjustment nut from the front end of the corresponding remote actuated leveling mechanism. In various embodiments, the first cabinet and second cabinet are positioned in a back-to-back orientation. The first back end may abut the second back end. In some embodiments, the method includes activating a vacuum engine of the first cabinet to sealingly couple the first back end with the second back end.

The method may include mounting a third cabinet on a third remote actuated leveling mechanism. The third cabinet has a third back end and a third front end. The method may include positioning the third cabinet adjacent to the first cabinet so that the first front end abuts the third front end and the first back end abuts the third back end. Further, the method may include operating the third remote actuated leveling mechanism to vertically move a portion of the third back end until its height substantially matches the abutting first back end. The method may include positioning a sealing gasket between the first back end and the third back end, and activating a vacuum engine of the first cabinet or the third cabinet to sealingly couple (1) the first front end with the third front end and (2) the first back end with the third back end. Additionally, the method may include operating a cooling system housed by the third cabinet to circulate air in the first cabinet.

In a third embodiment of the invention, a system includes a first cabinet, housing at least one server and having a first back end and a first front end, that is mounted on a first remote actuated leveling mechanism. The system also includes a second cabinet, housing at least one server and having a second back end and a second front end. The second cabinet is mounted on a second remote actuated leveling mechanism. The first and second cabinets are positioned so that (1) the first back end and the second back end are spaced apart by a first distance, and (2) the first front end and second front end are spaced apart by a second distance. The first distance is smaller than the second distance. Further, at least one of the first and second remote actuated leveling mechanisms is adjusted to substantially match a height of the first back end of the first cabinet with a height of the second back end of the second cabinet. The first cabinet and second cabinet may be positioned in a back-to-back orientation, and the first back end may abut the second back end.

BRIEF DESCRIPTION OF THE DRAWINGS

The foregoing features of embodiments will be more readily understood by reference to the following detailed description, taken with reference to the accompanying drawings, in which:

FIG. 1 depicts a conventional arrangement of cabinets that are installed in a space;

FIG. 2 depicts cabinets arranged in a back-to-back manner and installed in a space;

DETAILED DESCRIPTION OF SPECIFIC EMBODIMENTS

Computer systems can be organized by mounting servers in cabinets (also referred to herein as "racks"), interconnecting the servers, and stacking cabinets next to one another in a single space (e.g., within a large, climate controlled room). For example, a cabinet may house a number of chassis in its interior, and each chassis may be configured to receive a computer blade server. An operator may install computer equipment by inserting separate blade servers into each of the chassis. Because the controls for each blade servers (e.g., power button, interfaces for cables) may be positioned on a single exterior surface of the corresponding server, the operator may insert each blade server so that its controls face the front end of the cabinet. In this manner, when all of the computer blade servers have been installed, their controls will be accessible from the front of the cabinet. Then, an operator may interconnect the computer blade servers to communicate with one another, as well as configure each blade server's settings.

Since each cabinet has a movable door at its front end, once the computer blade servers have been set up, the operator may close the door to keep the servers out of view. When the operator wishes to access a particular computer blade server, the operator simply opens the door for the cabinet of interest. Because the blade server's controls are located on the same, front-facing surface, the operator may then operate the computer blade server, as needed. In some embodiments, the back end of the cabinet may be substantially sealed off, since the operator has no need to access it.

Figure 1:
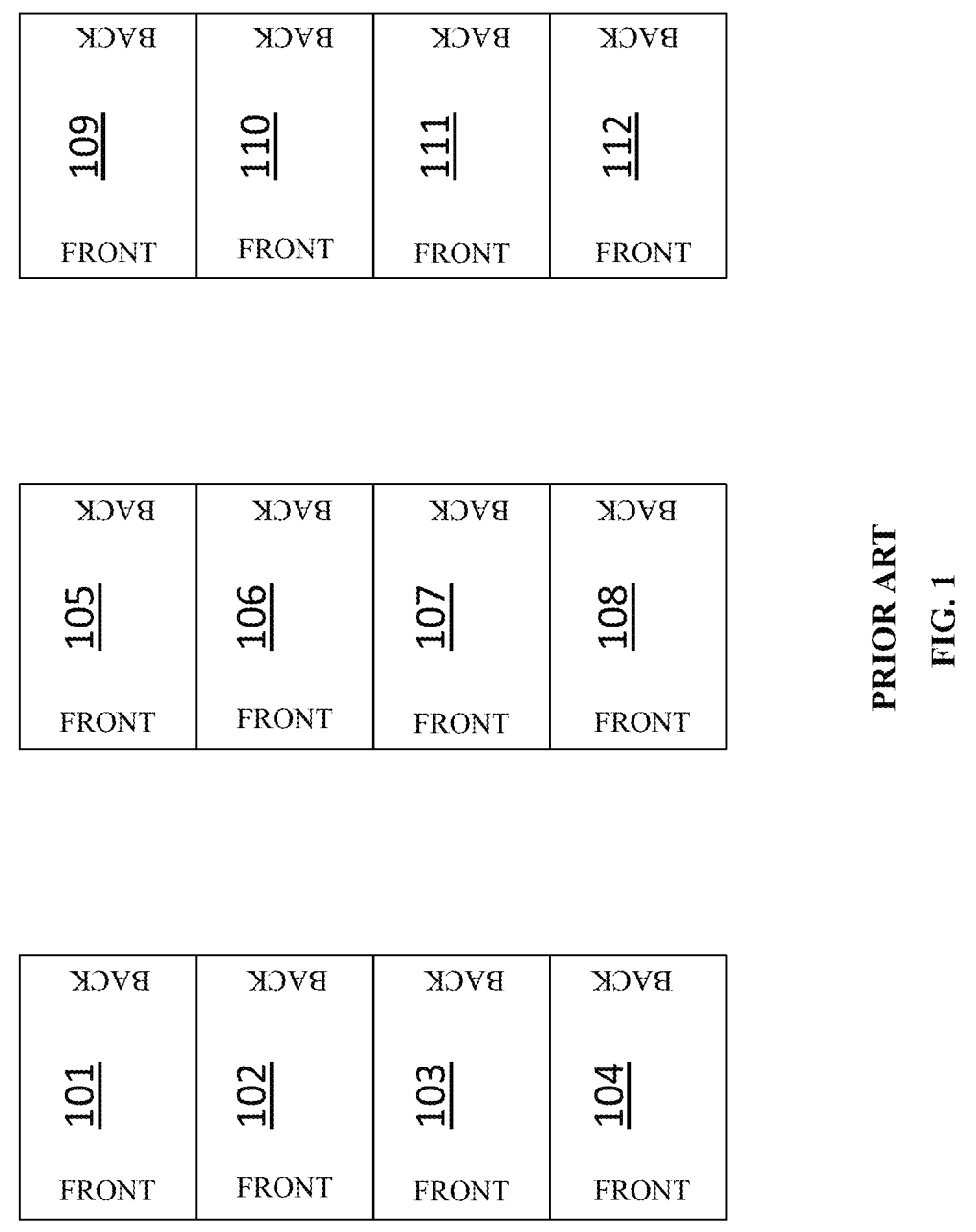

To install a cabinet in a space, the cabinets may be positioned next to one another in rows to form a high density, compact processing center. Conventionally, cabinets have been arranged in single rows, as depicted by the cabinets 101-112 in FIG. 1. Although the aisles enable operators to access the front of any cabinet in the computer system, the configuration wastes space. In particular, the aisles reduce the number of cabinets that may be installed in a room, and as a well, less computing capacity may be packed in a given amount space.

Figure 2:
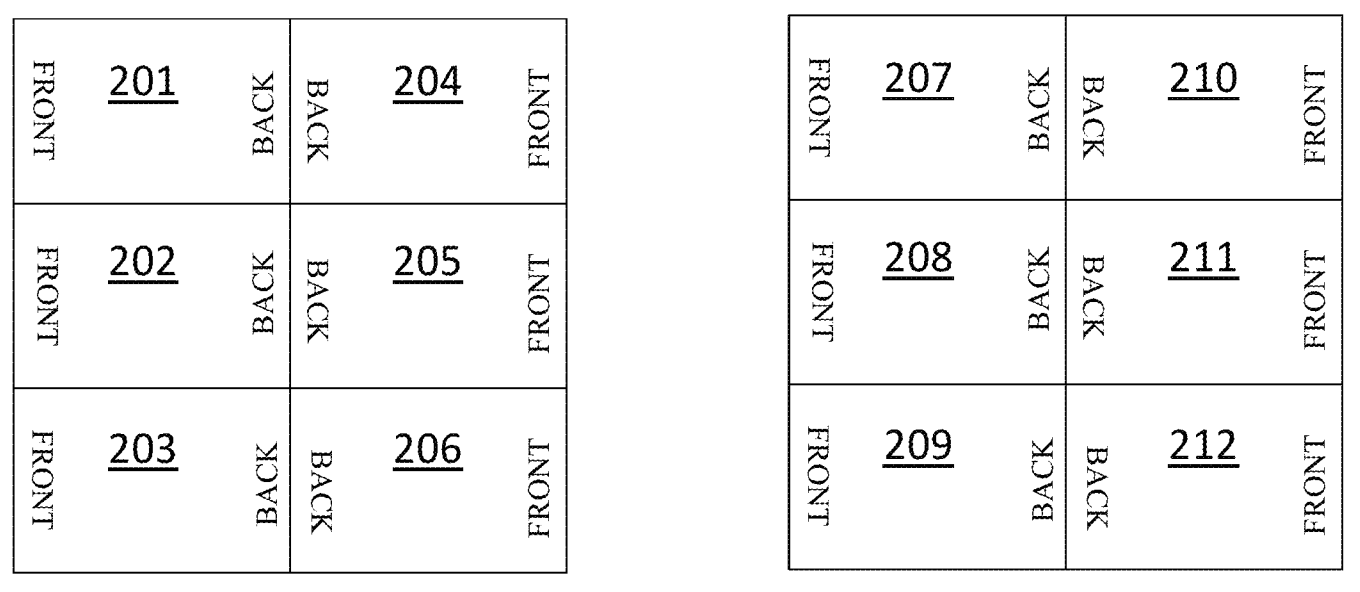

The inventor has begun abutting cabinets against each other in the back-to-back configuration depicted in FIG. 2. The configuration effectively permits more cabinets and thus, more computing power, to be resident in a given physical space. More specifically, this configuration reduces the required number of aisles, effectively increasing the amount of computing capacity that can be installed in the same amount of physical space. Although the figure depicts two groups of cabinets, each with six cabinets, additional cabinets may be installed to form longer groups having odd or even numbers of cabinets (e.g., seven, eight, ten, eleven, sixteen, nineteen, twenty, etc.).

Figure 3:
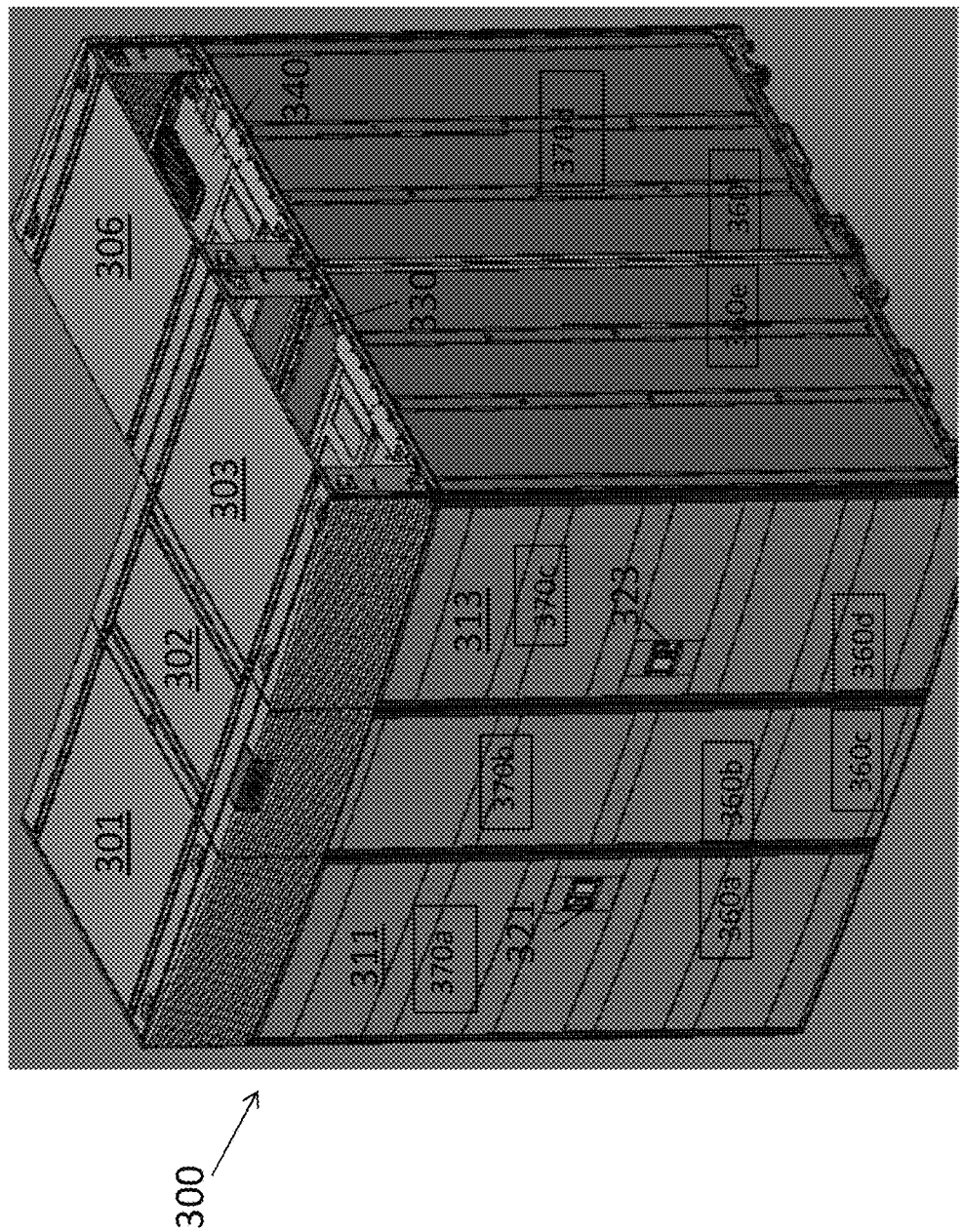
FIG. 3 depicts a group of cabinets arranged in a back-to-back manner, wherein the group of cabinets may be installed in a space as a unit.

Moreover, the inventor has been arranging cabinets in groups for installation. FIG. 3 depicts an exemplary set of cabinets 301, 302, 303, and 306 that may be installed together as a unit 300. Although only four cabinets are depicted, one of ordinary skill can appreciate that two additional cabinets could be positioned opposite cabinets 301 and 302 to form a unit 300 of six cabinets. In this unit, cabinets 301, 303, and 306 house computer equipment. Cabinet 301 has a movable door 311, and an operator may pull on handle 321 to open the door and access the interior of the cabinet 301. Likewise, cabinet 303 has a movable door 313 with a handle 323, and one of ordinary skill would appreciate that cabinet 306 has the same, facing the opposite direction.

As can be seen from the partial cross-section of cabinets 303 and 306, the cabinets 303 and 306 contain computer equipment 330 and 340. As described above, the equipment 330 and 340 may be computer blade servers that are installed in chassis within the interiors of cabinets 303 and 306. In some embodiments, when a single cabinet has been fully installed with computer equipment, the cabinet may weigh between about 2500 and about 3500 pounds. Moreover, in this embodiment, cabinet 302 may house an optional cooling system that circulates air to cool the computing equipment in cabinets 301 and 303. Likewise, an additional cabinet opposite cabinet 302 could house a cooling system to cool computing systems in cabinets 306 and a cabinet opposite cabinet 301. Alternatively, the two cabinets with cooling systems could circulate air among all six cabinets in the unit 300 to cool the computer equipment therein. In some embodiments of the unit 300 with six cabinets, four cabinets may be devoted to computing systems and two cabinets may be devoted to cooling systems. Other embodiments, however, may omit the cabinets 302 having the cooling system.

Moreover, in various embodiments, the cabinets 301, 302, 303, and 306 may be collectively sealed to form a closed system. Air would not be free to pass between the interior and exterior of the cabinets, except when operators open the cabinet doors 311 and 313 to access their interiors. When such a closed system is intact, cooling systems can efficiently and effectively propel cool air throughout the unit 300.

To achieve this closed system, in some embodiments, the cabinets 301, 302, 303, and 306 may be equipped with sealing gaskets 360a, 360b, 360c, 360d, 360e, 360f, respectively, each of which is configured to interface with a sealing gasket on another cabinet. Alternatively, an operator may insert sealing gaskets between abutting cabinets. Moreover, the cabinets 301, 302, 303, and 306 may include one or more vacuum engines 370a, 370b, 370c, 370d, respectively, which may generate suction with sufficient force to pull the cabinets 301, 302, 303, and 306 flush against one another. Furthermore, the cabinets 301, 302, 303, and 306 may include clamps (not shown) that an operator may manipulate to secure the cabinets together. In some embodiments, sealing trim may be applied to the remaining space between cabinets. Once this closed system has been formed, the cooling systems may circulate air between at least cabinets 301 and 303. In other embodiments, the cooling systems may circulate air between all the cabinets in a unit, whether that unit includes six, eight, or any other number of cabinets.

Although they improve the processing power density of the cabinets, the back-to-back configurations in FIGS. 2 and 3 create new problems. As depicted in FIG. 3, ideally, the cabinets 301, 302, 303, and 306 would be aligned with one another. For example, for two abutting cabinets, such as cabinets 301 and 302 or cabinets 303 and 306, the abutting surfaces may contact or abut one another substantially along their entire perimeters. In another example, the height of the back surface of cabinet 303 may match the height of the back surface of cabinet 306 wherever the surfaces contact or abut one another. Similarly, the heights of abutting surfaces for cabinets 302 and 303 may match wherever the surfaces contact or abut one another.

Such alignment enables the cabinets 301, 302, 303, and 306 in a unit to form a closed system when the cabinets are secured to one another, but when cabinets are installed in a space, the floors are seldom adequately level. When cabinets rest on uneven floors, they may no longer align with one another. Mismatches between the perimeters of abutting cabinets may prevent closed systems from being formed, and when cooling air leaks outside of the cabinets, instead of circulating among the cabinets, the computer equipment risks overheating and failing. When cabinets are positioned in an open system, the lifespan of the cabinets and time before repairs will be needed is reduced.

Figure 4:
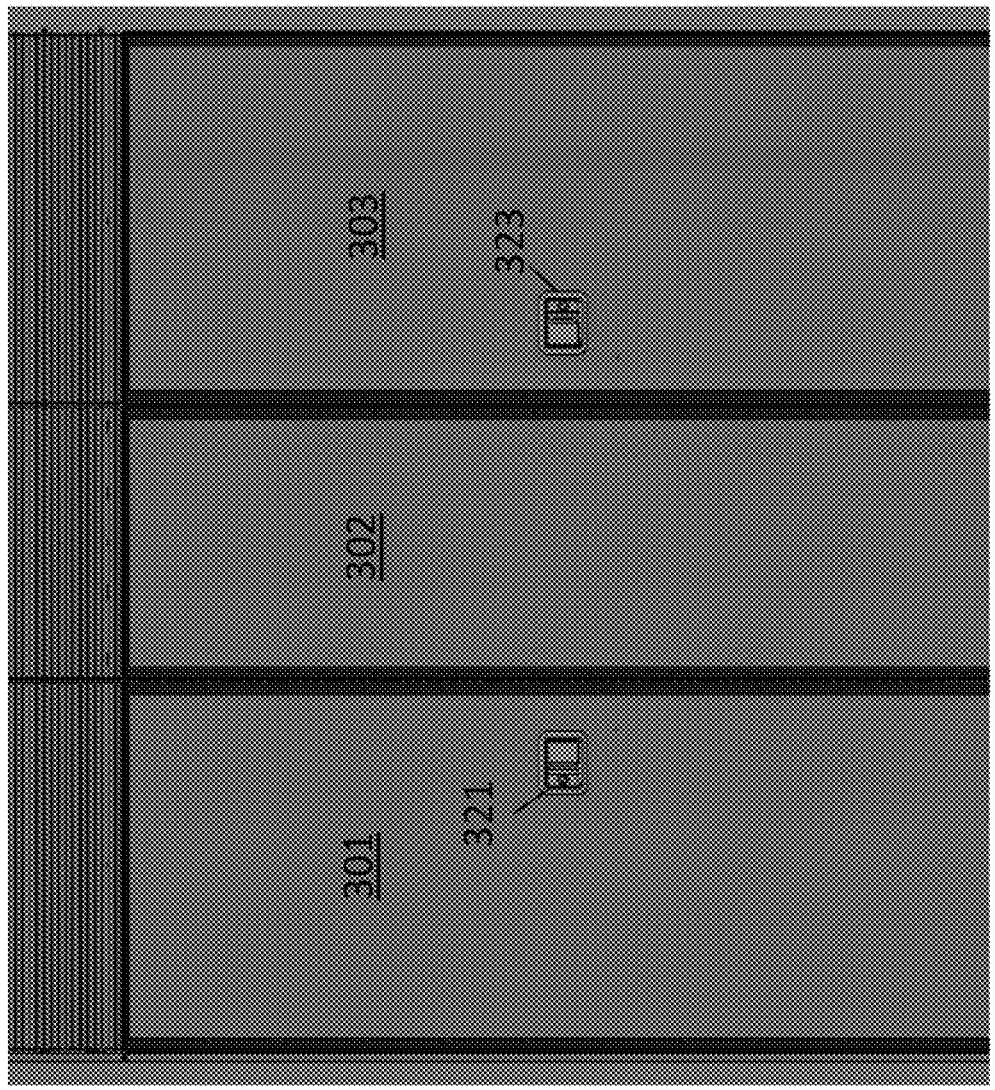
FIG. 4 depicts a front view of the group of cabinets of FIG. 3.

Additionally, positioning cabinets back-to-back renders their backsides inaccessible. Since the configuration renders cabinets accessible from the front, as depicted in FIG. 4, operators could not readily access the backs of the cabinets to correct their positions. Operators might need to prop up corners of cabinets, by way of example, to align cabinets. However, because each cabinet may weigh between 2500 and 3500 pounds, once a cabinet has been positioned, altering its position and making other adjustments becomes a difficult and cumbersome endeavor.

Figure 5:
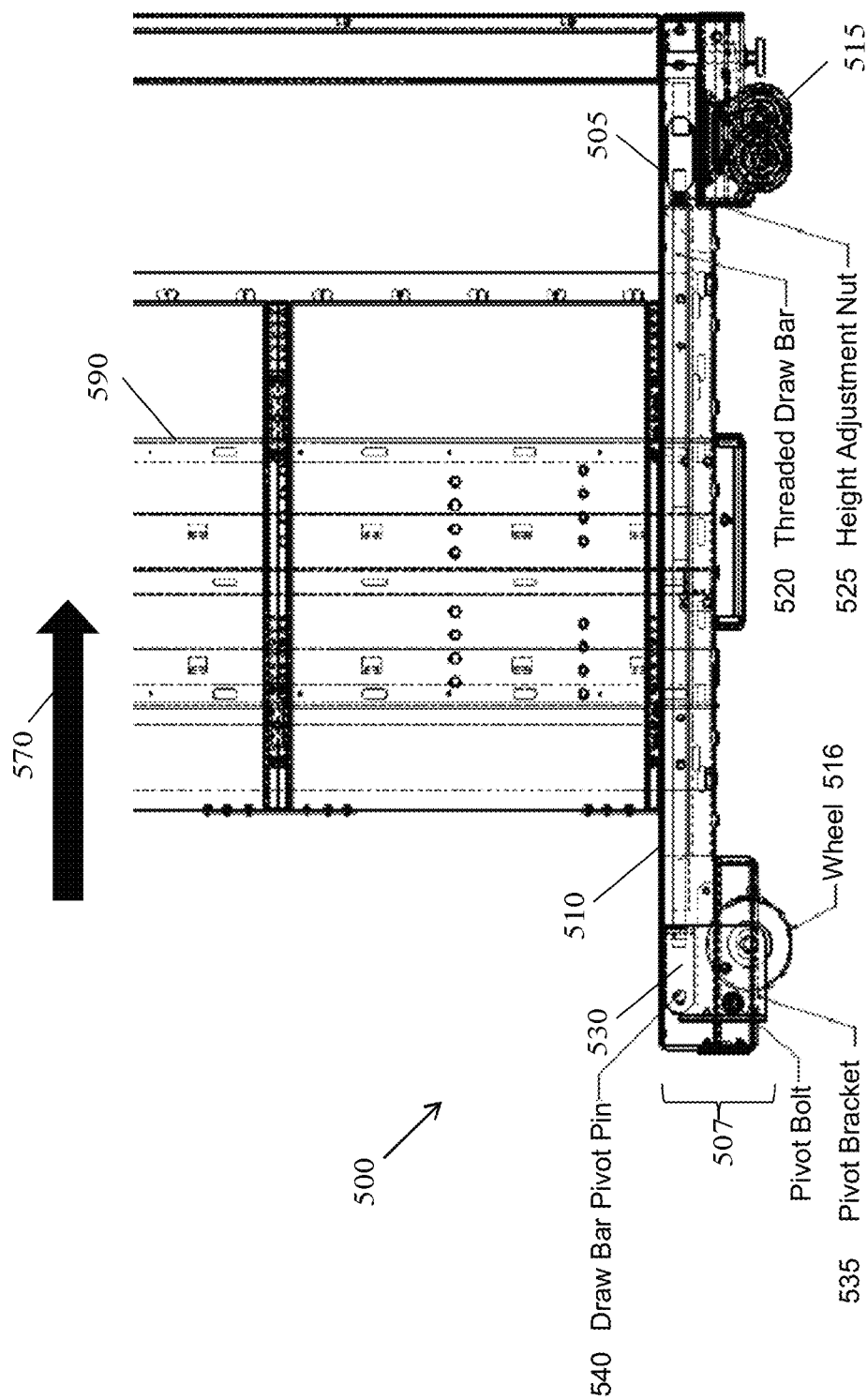
FIGS. 5 and 6 schematically depict side and oblique views, respectively, of a remote actuated leveling mechanism supporting a cabinet of computer equipment in accordance with illustrative embodiments of the invention.
Figure 6:
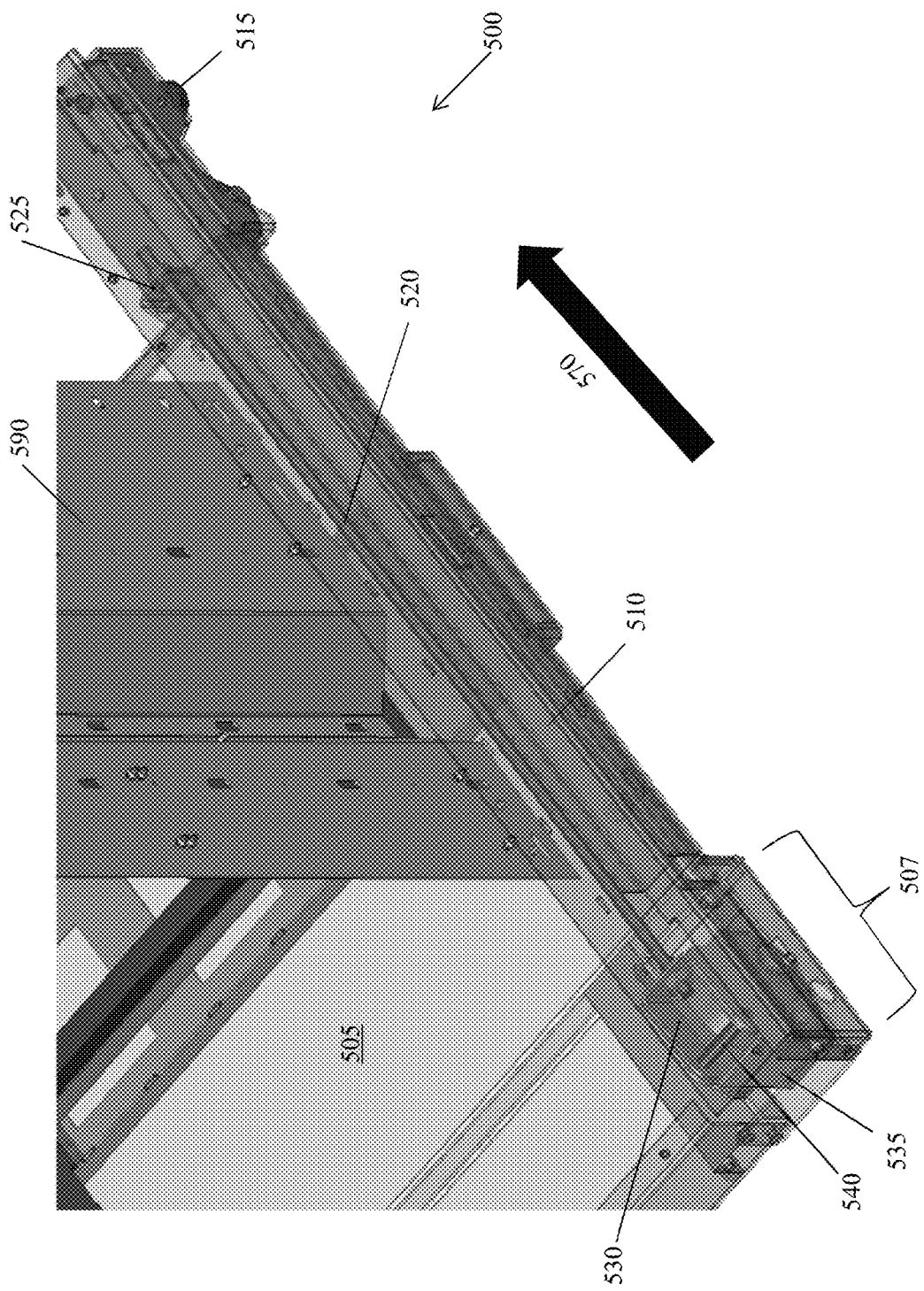

To solve this problem, illustrative embodiments mount cabinets on their respective leveling mechanisms 500 (also referred to herein as "levelers"). More specifically, the leveler 500 is referred to as a "remote actuated" leveler 500 because it permits an operator to adjust the height of the back of a cabinet without directly accessing the back. To that end, FIGS. 5 and 6 schematically show one embodiment of a leveler 500 configured in accordance with illustrative embodiments. In that embodiment, the leveler 500 has a platform 505 configured to support at least one cabinet (not shown), a height adjuster 507 to adjust the height of the back end of the platform, and a control 525 accessible from a front end of the platform 505 to control the height adjuster 507 and thus, the height of the back end of the platform 505. Alternative embodiments may position the control 525 on a side of the platform 505 (e.g., if the cabinet is at the end of a line of cabinets), or both in the front and side of the platform.

Figure 7:
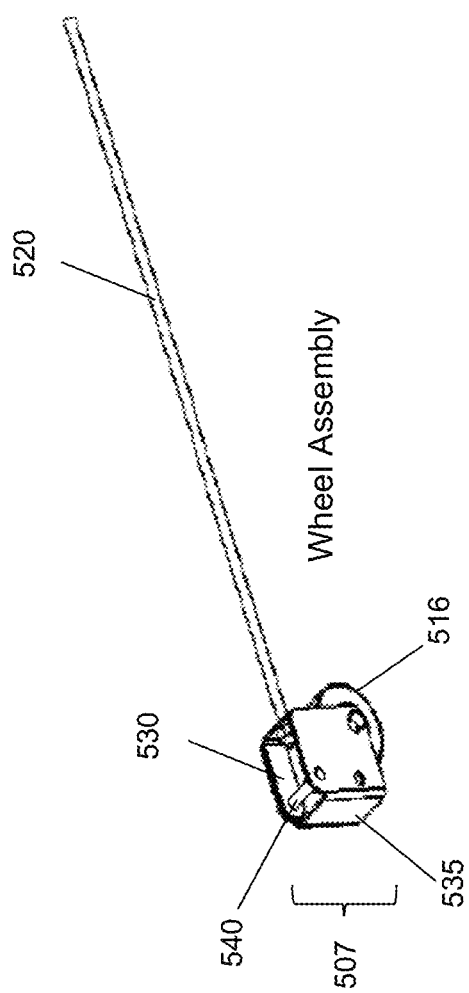
FIG. 7 schematically depicts a wheel assembly used in the remote actuated leveling mechanism in accordance with illustrative embodiments of the invention.

In more detail, the leveler 500 has the above noted platform 505 that supports the cabinet 590, with rails 510 running along two sides of the platform 505. Each rail 510 includes a front wheel 515 used in moving the platform 505 and cabinet 590. Further, each rail 510 houses a height adjuster 507, which includes a wheel assembly such as the assembly depicted in FIG. 7. The wheel assembly includes a back wheel 516, as well as components that enable an operator to vertically move the back end of a cabinet using the control 505 operable from the front end of the leveler 500. Since the platform 505 includes at least two rails and consequently at least two height adjusters 507, each height adjuster 507 enables an operator to vertically move a different portion of the back end. For example, the height adjusters 507 may be positioned on opposite sides of the back end of the platform 505. In various embodiments, the platform 505 may include any number of height adjusters 507 and corresponding controls 525, which may be positioned along the platform 505 in any configured desired by one of ordinary skill in the art.

In some embodiments, the wheel assembly includes a bar, such as a threaded draw bar 520, that extends through the rail 510. A control, such as a height adjustment nut 525, is disposed on one end of the threaded draw bar 520 to give the operator the ability to adjust the height of the back end of the cabinet. At its other end, the draw bar 520 is connected to a linkage 530 that is housed within a pivot device, such as a pivot bracket 535. Since the linkage 530 has a rectangular shape, manipulating the linkage 530 to change its position would increase or decrease the vertical position of the platform 505, and consequently, the vertical position of the cabinet on the top surface of the platform 505. The linkage 530 and the pivot bracket 535 may be coupled to one another using a pivot pin 540, which enables the linkage 530 to rotate into different positions. In some embodiments, the pivot pin 540 couples one end of the linkage 530 to a corner of the pivot bracket 535. Further, the pivot bracket 535 is coupled to a back wheel 516, which anchors the height adjuster 507 to the platform 505. In some embodiments, the pivot bracket 535 is coupled to the axle of the back wheel's 516 so that the bracket 535 may pivot around this axle, thereby changing its position and the consequent vertical position of the platform 505.

Figure 8:
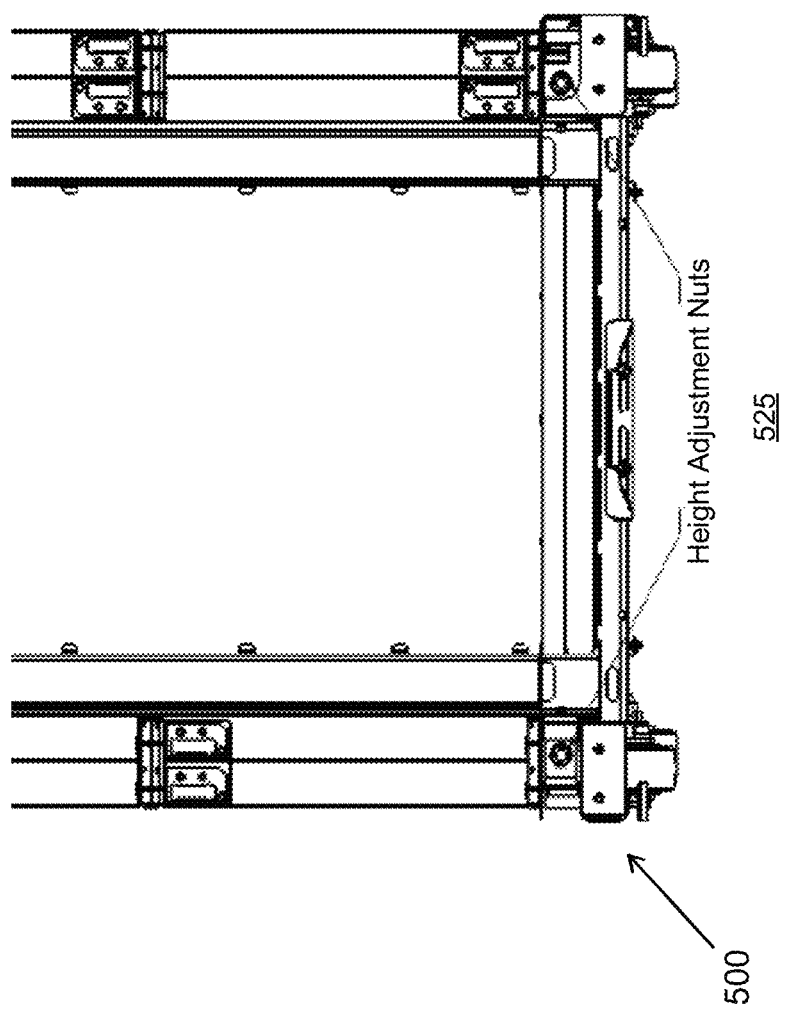
FIG. 8 schematically depicts a front view of the remote actuated leveling mechanism configured in accordance with illustrative embodiments of the invention.

In use, an operator increases or decreases the height of the back of the cabinet by manipulating the height adjustment nuts 525. These nuts 525 are accessible from the front of the leveler 500, as depicted in FIG. 8, although in some embodiments, the nuts 525 are accessible from the side of the leveler 500. In some embodiments, an operator may rotate a nut 525 clockwise to increase the height of a portion of the back end of the cabinet, or rotate the nut 525 counterclockwise to decrease the height. When the operator manipulates the nut 525 to increase the height, the rotation pulls the threaded draw bar 520 forward, e.g., in the direction indicated by the arrows 570 in FIGS. 5 and 6. The draw bar 520 engages the linkage 530 to pull the bracket 535 forward from the pivot pin 540. As a result, the bracket 535 rotates clockwise around the axle of the back wheel 516 from the pivot pin 540, and pushes down on the back wheel 516. Because of the bracket's 535 rectangular shape, as the bracket 535 rotates, the bracket 535 raises the back of the platform 505.

Thus, to install a cabinet using the leveler 500, the operator may mount the cabinet 590 onto the leveler's platform 505 and roll the cabinet 590 to its intended position. After the cabinet 590 has been positioned (e.g., against a wall, against another cabinet), the operator may compare the heights of the backs of adjacent cabinets. If a cabinet is lower than its neighbor, the operator may turn the height adjustment nut 525 proximate to the appropriate cabinet to increase the height of the back of that cabinet until the cabinets are level with one another. In some situations, the operator may turn the height adjustment nut 525 to lower the back of a cabinet for achieving the same level effect.

In another example, an operator may mount another cabinet on a leveler's platform and roll the cabinet so that its back end abuts the back end of an already installed cabinet 590. In this situation, the operator must compare the heights of the back ends of the cabinets. In some situations, the heights may be mismatched along the entire abutting surfaces of the back ends. Thus, by way of example, the operator may control the height adjustment nuts 525 for both height adjusters 507 in a cabinet's platform 505 to raise or lower different portions of the back end of one cabinet until their heights match the back end of the abutting cabinet. In other situations, the heights may be mismatched at one side of the abutting back ends, but they may match at the other side. The operator may control the height adjustment nut 525 for a height adjuster 507 located by the mismatching portions of the back ends to raise or lower one of the portions until their heights match. In this manner, an operator may install cabinets of computer equipment and/or cooling systems in an area with an uneven floor, while ensuring that the cabinets are all level. After all of the computer system's cabinets are installed, an operator may seal off the cabinets to form a closed system in which cool air circulates among the servers. Further, the operator may apply trim, such as vinyl, to make the computer system more aesthetically pleasing.

The leveler 500 preferably is formed from materials that can support large amounts of weight, since the cabinet fits a larger number of components in a small footprint. In some embodiments, the front and/or back wheels are made of machine plastic that does not shatter under the weight of a cabinet fully loaded with computer equipment. In various embodiments, all of the other components (e.g., draw bar 520, pivot bracket 535, linkage 530, rail 510) are made of steel. For a leveler 500 that supports a cabinet with computer equipment, some embodiments may set the diameter of its draw bar 520 at about 12.0 mm. Moreover, this exemplary system may set its pivot bracket 535 to be about 2.0 inches wide, and its back wheel at a diameter of about 4.0 inches. For an exemplary leveler 500 that supports a cabinet with a cooling system, the diameter of its draw bar 520 may be about 8.0 mm, its pivot bracket 535 may be about 1.0 inch wide, and its back wheel may have a diameter of about 4.0 inches. Indeed, these specific sizes are illustrative and thus, not intended to limit various embodiments of the invention.

Figure 9:
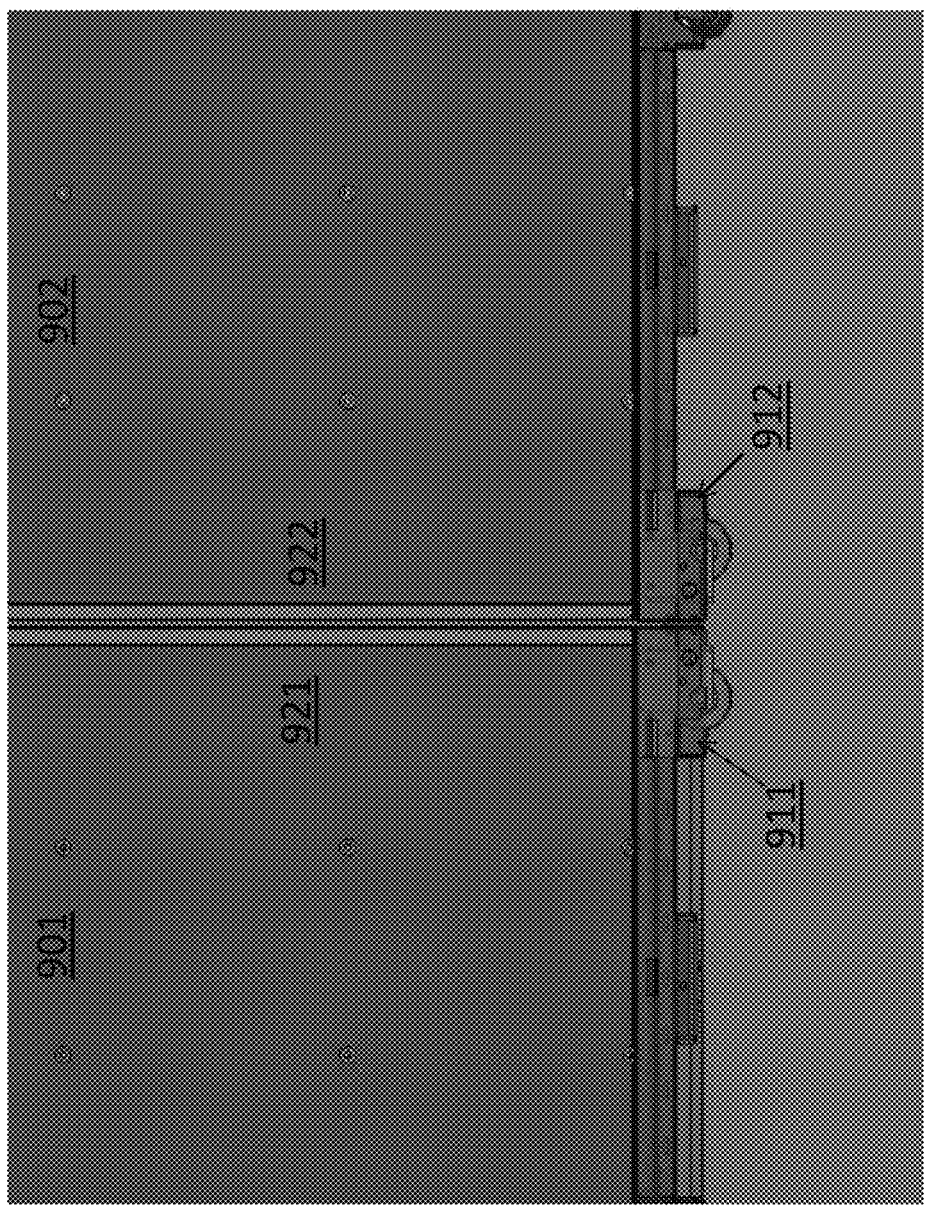
FIG. 9. depicts two cabinets, each mounted on their respective remote actuated leveling mechanisms, which have been positioned back-to-back.
Figure 10:
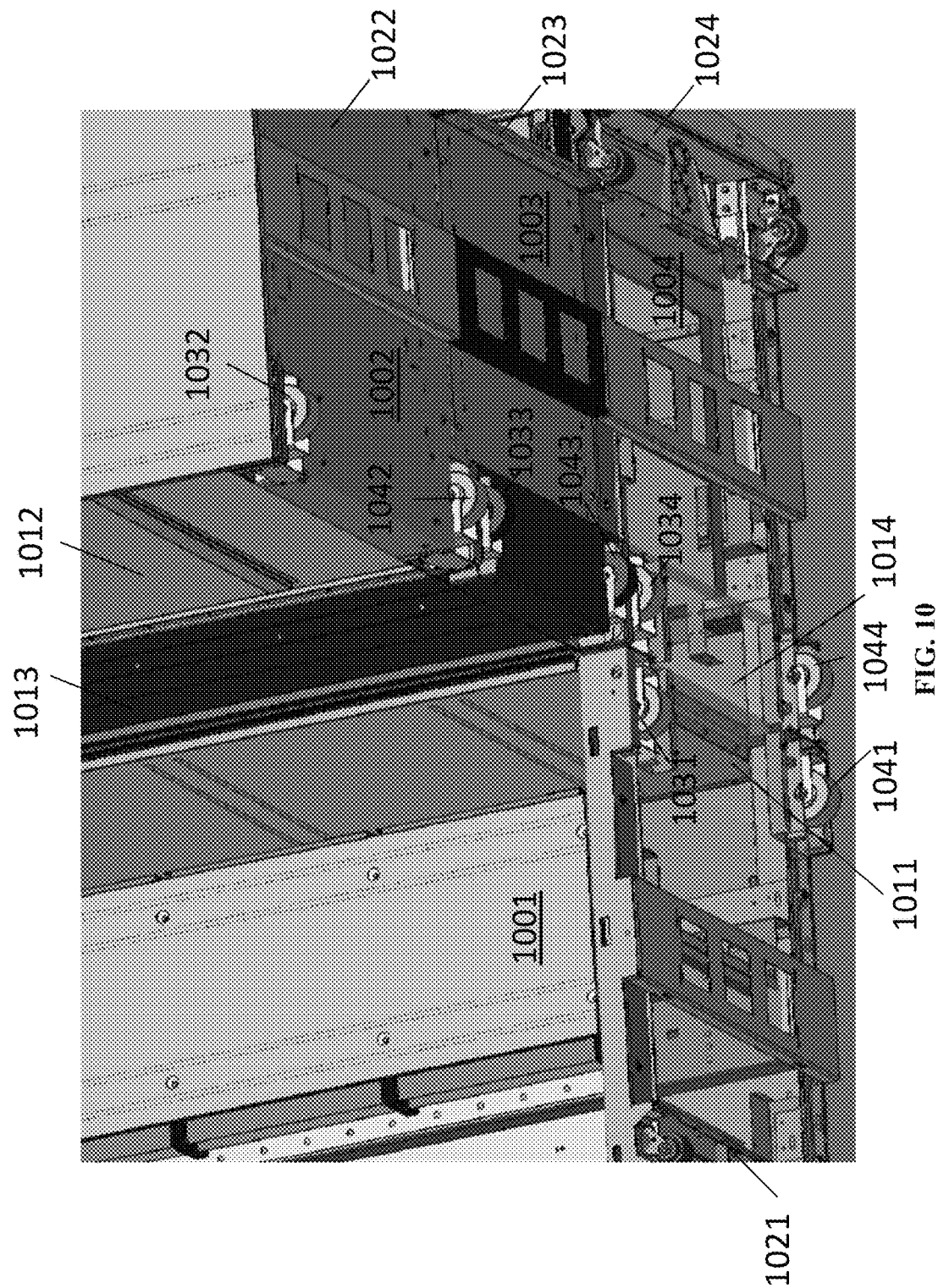
FIG. 10 depicts four cabinets, each mounted on their respective remote actuated leveling mechanisms, positioned next to one another according to the arrangement depicted in FIG. 3.

FIGS. 9 and 10 depict cabinets of equipment that have been mounted on exemplary remote actuated leveling mechanisms described herein and positioned next to one another. Specifically, FIG. 9 depicts two such cabinets 901 and 902, each of which has been mounted on its respective remote actuated leveling mechanism 911 and 912. The cabinets 901 and 902 have been positioned back-to-back such that the pivot brackets on the levelers 911 and 912 abut one another. Although the arrangement renders the backs 921 and 922 of the cabinets 901 and 902 inaccessible, if the heights of the backs 921 and 922 of the cabinets 901 and 902 do not match, due to an uneven floor, the levelers 911 and 912 may be adjusted from the front of the cabinets 901 and 902 to vertically move the backs 921 and 922. An operator may adjust one or both levelers 911 and 912 until the heights of the back ends 921 and 922 match, before sealing the cabinets to form a closed system.

FIG. 10 schematically shows a bottom view of four cabinets 1001, 1002, 1003, and 1004, each mounted on their respective levelers having height adjusters positioned on opposite sides of each platform. The four cabinets 1001, 1002, 1003, and 1004 are positioned according to the arrangement depicted in FIG. 3. In this arrangement, cabinets 1002, 1003, and 1004 are positioned adjacent to one another. The front end 1022 of cabinet 1002 abuts the front end 1023 of cabinet 1003, and the front end 1023 of cabinet 1003 abuts the front end 1024 of cabinet 1004. Likewise, the back end 1002 of cabinet 1002 abuts the back end 1003 of cabinet 1003, and the back end 1003 of cabinet 1003 abuts the back end 1004 of cabinet 1004. Moreover, cabinets 1001 and 1004 have been positioned in a back-to-back configuration. Thus, the back end 1011 of cabinet 1001 abuts the back end 1014 of cabinet 1004.

Aligning the cabinets may require an operator to control one or more of the height adjusters 1031, 1041, 1032, 1042, 1033, 1043, 1034, and 1044. For example, for adjacent cabinets 1002 and 1003, an operator may control height adjuster 1042, height adjuster 1033, or both until the heights of adjacent portions of their back ends 1012 and 1013 match. Similarly, for adjacent cabinets 1002 and 1004, an operator may control height adjuster 1043, height adjuster 1034, or both until the heights of adjacent portions of their back ends 1013 and 1014 match.

Because cabinets 1001 and 1004 are positioned in a back-to-back manner, more adjustments may need to be made to align these two cabinets 1001 and 1004. In particular, an operator must align the portions of the back ends 1011 and 1014 proximate to height adjusters 1031 and 1034, as well as the portions of the back ends 1011 and 1014 proximate to height adjusters 1041 and 1044. If cabinets 1001 and 1004 are the first two cabinets to be installed, an operator may control any of height adjusters 1031, 1034, 1041, and 1044 to vertically move different portions of the back ends 1011 and 1014. In this manner, the operator may ensure that the heights of the back ends 1011 and 1014 match whenever the back ends 1011 and 1014 contact or abut one another. However, if cabinet 1003 has already been installed next to cabinet 1004, then the heights of the back ends 1013 and 1014 of cabinets 1003 and 1004 have already been aligned. Thus, presumably, the operator may not disturb height adjuster 1034 without causing misalignment between cabinets 1003 and 1004. However, the operator may control the other three remaining height adjusters 1031, 1041, and 1044 to align the back ends 1011 and 1014 of these abutting cabinets 1001 and 1004.

Accordingly, illustrative embodiments enable precise alignment of abutting cabinets regardless of the minor structural imperfections in the floor of the room in which they are located. Such embodiments therefore permit large server cabinets to be oriented in a manner that minimizes their overall space requirements, effectively increasing processing power density within a given processing area.

Various embodiments of the present invention may be characterized by the potential claims listed in the paragraphs following this paragraph (and before the actual claims provided at the end of this application). These potential claims form a part of the written description of this application. Accordingly, subject matter of the following potential claims may be presented as actual claims in later proceedings involving this application or any application claiming priority based on this application. Inclusion of such potential claims should not be construed to mean that the actual claims do not cover the subject matter of the potential claims. Thus, a decision to not present these potential claims in later proceedings should not be construed as a donation of the subject matter to the public.

The embodiments of the invention described above are intended to be merely exemplary; numerous variations and modifications will be apparent to those skilled in the art. All such variations and modifications are intended to be within the scope of the present invention as defined in any appended claims.

What is claimed is:

1. A method of installing computer equipment in a space, the method comprising:
   mounting a first cabinet with at least one server on a first remote actuated leveling mechanism, the first cabinet having a first back end, a first front end, and a vacuum engine;
   mounting a second cabinet with at least one server on a second remote actuated leveling mechanism, the second cabinet having a second back end and a second front end;
   positioning the first and second cabinets so that the first back end and second back end are spaced apart by a first distance, the first and second cabinets being positioned so that the first front end and second front end are spaced apart by a second distance, the first distance being smaller than the second distance;
   operating at least one of the remote actuated leveling mechanisms to vertically move a portion of the first back end, a portion of the second back end, or portions of both the first and second back ends; and
   activating the vacuum engine of the first cabinet to sealingly couple the first back end with the second back end of the second cabinet.

2. The method of claim 1, further comprising:
   operating a cooling system housed by the first cabinet to circulate air in the first cabinet and second cabinet.

3. The method of claim 1, further comprising:
   positioning a sealing gasket between the first back end of the first cabinet and the second back end of the second cabinet.

4. The method of claim 1, wherein operating at least one of the remote actuated leveling mechanisms comprises:
   vertically moving the portion of the first back end until its height substantially matches the portion of the second back end.

5. The method of claim 1, wherein operating at least one of the remote actuated leveling mechanisms comprises:
   adjusting a control from a front end of the remote actuated leveling mechanism to change a vertical height of a back end of the corresponding cabinet, a front end of the corresponding cabinet remaining at substantially the same height throughout the adjusting.

6. The method of claim 5, wherein adjusting the control from the front end comprises:
   rotating a height adjustment nut from the front end of the corresponding remote actuated leveling mechanism.

7. The method of claim 1, wherein the first cabinet and second cabinet are positioned in a back-to-back orientation.

8. The method of claim 1, further comprising:
   mounting a third cabinet on a third remote actuated leveling mechanism, the third cabinet having a third back end and a third front end;
   positioning the third cabinet adjacent to the first cabinet so that the first front end abuts the third front end and the first back end abuts the third back end; and
   operating the third remote actuated leveling mechanism to vertically move a portion of the third back end until its height substantially matches the abutting first back end,
   wherein activating the vacuum engine of the first cabinet sealingly couples the first front end of the first cabinet with the third front end of the third cabinet and the first back end of the first cabinet with the third back end of the third cabinet.

9. The method of claim 8, further comprising:
   operating a cooling system housed by the first cabinet to circulate air in the first cabinet, the second cabinet, and the third cabinet.

10. The method of claim 9, further comprising:
    positioning a sealing gasket between the first back end of the first cabinet and the third back end of the third cabinet.

11. A system comprising:
    a first cabinet, housing at least one server, mounted on a first remote actuated leveling mechanism, the first cabinet having a first back end, a first front end, and a vacuum engine;
    a second cabinet, housing at least one server, mounted on a second remote actuated leveling mechanism, the second cabinet having a second back end and a second front end;
    wherein the first and second cabinets are positioned so that the first back end and the second back end are spaced apart by a first distance, and the first front end and second front end are spaced apart by a second distance, the first distance being smaller than the second distance; and
    wherein at least one of the first and second remote actuated leveling mechanisms is adjusted to substantially match a height of the first back end of the first cabinet with a height of the second back end of the second cabinet, such that activation of the vacuum engine of the first cabinet sealingly couples the first back end of the first cabinet with the second back end of the second cabinet.

12. The method of claim 11, wherein the first cabinet further comprises a cooling system configured to circulate air in the first cabinet and the second cabinet.

13. The system of claim 11, wherein the first cabinet includes a first sealing gasket at the first back end configured to interface with a second sealing gasket at the second back end of the second cabinet.

14. The system of claim 11, wherein the first cabinet and second cabinet are positioned in a back-to-back orientation.

15. The system of claim 11, further comprising a third cabinet, housing at least one server, mounted on a third remote actuated leveling mechanism, the third cabinet having a third back end and a third front end, wherein the third cabinet is positioned adjacent to the first cabinet so that the first front end of the first cabinet abuts the third front end of the third cabinet and the first back end of the first cabinet abuts the third back end of the third cabinet, wherein at least one of the first and third remote actuated leveling mechanisms is adjusted to substantially match a height of the first back end of the first cabinet with a height of the third back end of the third cabinet, and wherein activation of the vacuum engine of the first cabinet sealingly couples the first back end of the first cabinet with the third back end of the third cabinet and the first front end of the first cabinet with the third front end of the third cabinet.

16. The system of claim 15, wherein the first cabinet and third cabinet are positioned in a side-by-side orientation.

17. The method of claim 15, wherein the first cabinet further comprises a cooling system to circulate air in the first cabinet, the second cabinet, and the third cabinet.

18. The system of claim 15, wherein the first cabinet includes a third sealing gasket disposed on the first back end configured to interface with a fourth sealing gasket disposed on the third back of the third cabinet.

* * * * *